United States Patent [19]
Moyes

[11] Patent Number: 5,500,600
[45] Date of Patent: Mar. 19, 1996

[54] APPARATUS FOR MEASURING THE ELECTRICAL PROPERTIES OF HONEYCOMB CORE

[75] Inventor: Tom S. Moyes, Valencia, Calif.

[73] Assignee: Lockheed Corporation, Calabasas, Calif.

[21] Appl. No.: 270,970

[22] Filed: Jul. 5, 1994

[51] Int. Cl.⁶ .................................................. G01R 27/04
[52] U.S. Cl. ........................................ 324/639; 324/642
[58] Field of Search ................................... 324/637, 639, 324/647, 334, 337, 338, 640–646, 648, 95

[56] References Cited

U.S. PATENT DOCUMENTS

| | | | |
|---|---|---|---|
| 4,103,224 | 7/1978 | Taro et al. | 324/636 |
| 4,588,993 | 5/1986 | Babij | 343/351 |
| 4,829,238 | 5/1989 | Goulette | 324/95 |
| 5,028,866 | 7/1991 | Wiese | 324/158 |
| 5,177,444 | 1/1993 | Cutmore | 324/637 |

OTHER PUBLICATIONS

Frank M. Greene, A New Near–Zone Electric–Field–Strength Meter, May 17, 1966; Journal of Research of the National Bureau of Standards–C. Engineering and Instrumentation, vol. 71C, No. 1, Jan.–Mar. 1967.

Primary Examiner—Ernest F. Karlsen
Assistant Examiner—Russell M. Kobert
Attorney, Agent, or Firm—Louis L. Dachs

[57] ABSTRACT

The invention is an apparatus for measuring the attenuation of electromagnetic radiation between cells of honeycomb core. In detail, the apparatus includes at least two antennas in a spaced relationship. A positioning system is used for positioning the at least two antennas within individual cells of the core. An analysis system is coupled to the antennas for measuring the attenuation of the radiated electromagnetic radiation between one of the antennas operating in a radiating mode and a second operating in a receiving mode and providing a graphical representation of the attenuation as a function of frequency, depth, length or width.

21 Claims, 7 Drawing Sheets

APPARATUS FOR MEASURING THE ELECTRICAL PROPERTIES OF HONEYCOMB CORE

BACKGROUND OF THE INVENTION

1. Field of the Invention

The invention relates to the field of inspection systems and, in particular, to an apparatus for measuring the attenuation of electromagnetic radiation through honeycomb core coated with electromagnetic radiation absorbing materials.

2. Description of Related Art

Honeycomb core is often used in the leading and trailing edges of airfoils and other control surfaces as and numerous other locations on aircraft. In order to achieve a low radar cross-section, the core is coated with radar absorbing materials. However the core must be inspected to insure that it has the required absorbing properties. This is normally accomplished prior to machining to its final shape and, certainly prior to the bonding of cover sheets there over. Otherwise failure to meet the absorption requirements would result in the scrappage of very expensive parts. If the core is inspected immediately after coating, reworking, in most instances, becomes an easy task. In the past, bulk properties were measured be illuminating the coated core and determining the overall absorption thereof. However, this procedure while, easily determining whether a part was acceptable, could not isolate the imperfections in a failed part.

U.S. Pat. Nos. 4,829,238, "Method And Apparatus for Monitoring Electromagnetic Emission Levels" by R. R. Goulette, et. al. and 5,028,866, "Method And AppAratus Form Mapping Printed Circuit Fields" by R. W. Wiese are both interest in that they disclose the use of small antenna probes to monitor and map the emissions from printed circuit boards. However, they are on no use in the inspection of honeycomb core since they depend upon sensing emissions from the object being monitored and honeycomb core is not itself an emitter. U.S. Pat. No. 4,588,993, "Broadband Isotropic Probe System For The Simultaneous Measurement of Complex E- And H-Fields" by T. M Babij, et. al. is of more interest in that it uses a combination of three mutually orthogonal dipole antennas and a set of three mutually orthogonal loop antennas to map the E and H fields of a closed space. However, it does not teach the use of a pair of antennas to transmit and receive electromagnetic radiation within honeycomb core to measure the attenuation of a transmitted signal for determining the acceptability of the core as a radar absorbing structure.

Thus it is a primary object of the subject invention to provide an apparatus for measuring the attenuation of electromagnetic radiation through honeycomb core coated with electromagnetic radiation absorbing materials.

It is another primary object of the subject invention to provide an apparatus for measuring the attenuation of electromagnetic radiation between individual cells of honeycomb core coated with electromagnetic radiation absorbing materials.

It is a further object of the subject invention to provide an apparatus for measuring the attenuation of electromagnetic radiation through honeycomb core coated with electromagnetic radiation absorbing materials at various frequencies.

It is a still further object of the subject invention to provide an apparatus for measuring the attenuation of electromagnetic radiation at various locations within honeycomb core coated with electromagnetic radiation absorbing materials.

SUMMARY OF THE INVENTION

The invention is an apparatus for measuring the attenuation of electromagnetic radiation between cells of honeycomb core to determine its effectiveness as a electromagnetic energy absorber. In detail, the apparatus includes at least two antennas in spaced relationship. Preferably, the individual antennas are loop antennas that are mounted on the ends of semi-rigid shafts. In addition, the semi-rigid shafts are covered with an electromagnetic energy absorbing material and the actual loop antennas are covered with a low dielectric cover to prevent dust and debris from collecting thereon. It also attenuates the surface currents that would normally by generated on the outer conductor of the coax cable, thus confining the active area to the actual loop antenna. This eliminates the need for a balun which is commonly used to match coaxial cables to dipole antennas to minimize RF currents on the outer shield of the coaxial cable which would otherwise distort radiation patterns. An ideal semi-rigid shaft is a semi-rigid coax cable with the loop antenna being a wire joined at one end to the inner conductor and the other end joined to the other conductor. Electrically small loop antennas are, by their nature, relatively insensitive to changes in a dielectric medium. This allows it to be placed in a dielectric medium such as found in loaded honeycomb core for the purpose of measuring the internal electromagnetic radiation attenuation.

An antenna assembly positioning system is included for positioning the at least two antenna assemblies within individual cells of the core. The positioning system includes a platform having a surface for mounting the core. A carriage is mounted on the platform and is movable along the surface of the platform and, thus, over the core. The at least two antenna assemblies are attached to a support structure that is movably mounted to the carriage such it is movable vertically upward and downward. Thus with the carriage movable over the core and the support structure able to move the at least two antenna assemblies into and out of the core and to specific depths therein, a complete determination of the attenuating properties of the core can be obtained.

An electronic system is coupled to the at least two antennas and includes a network analyzer for measuring the attenuation of the radiated electromagnetic radiation at different frequencies between one of the antennas acting in a radiating mode and a second antenna operating in a receiving mode. The electronic system further includes a switching matrix assembly that switches between different pairs of antennas. Plots of the attenuation (dB loss) between the two selected antenna assemblies can be provided as a function of depth and length for various frequencies.

The novel features which are believed to be characteristic of the invention, both as to its organization and method of operation, together with further objects and advantages thereof, will be better understood from the following description in connection with the accompanying drawings in which the presently preferred embodiment of the invention is illustrated by way of example. It is to be expressly understood, however, that the drawings are for purposes of illustration and description only and are not intended as a definition of the limits of the invention.

DESCRIPTION OF THE PREFERRED EMBODIMENT

Figure 1:
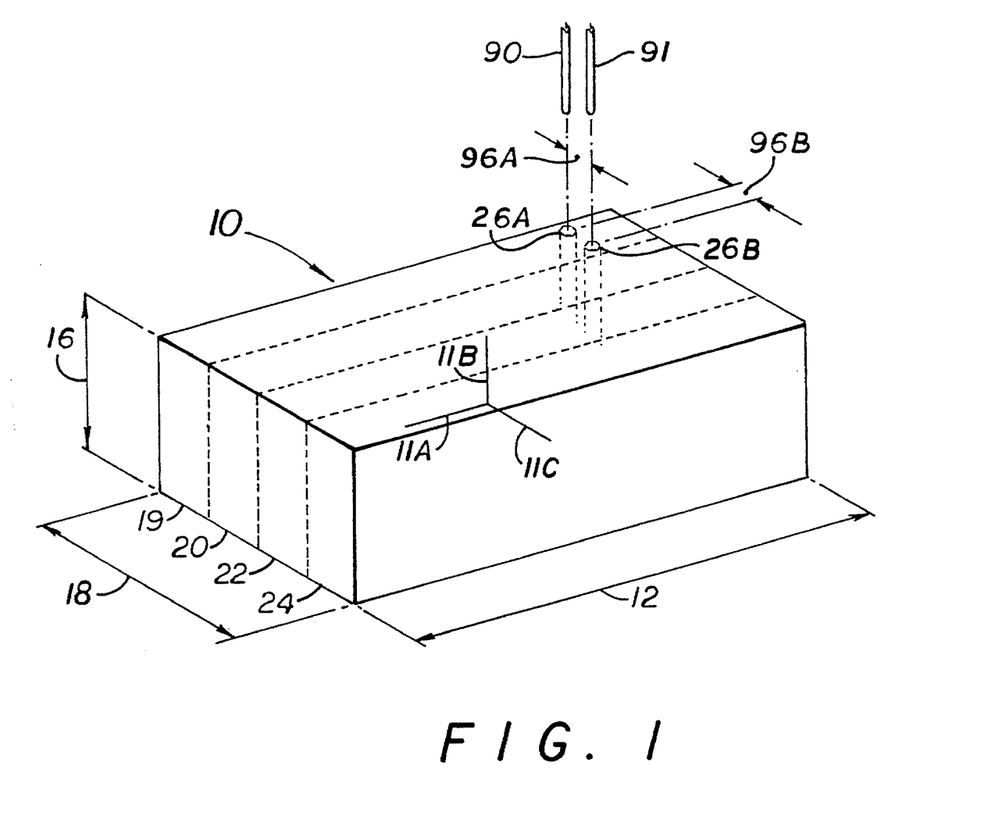
FIG. 1 is a perspective view of a piece of honeycomb core that is loaded with electromagnetic absorbing material having antenna assemblies positioned there above for measuring the attenuation between the cells.

A block of core, generally indicated by numeral 10, is illustrated in FIG. 1 having a longitudinal axis 11A, vertical axis 11B, lateral axis 11C, a length 12, a height 16 and a width 18. For purposes of illustration, the core 10 is shown coated with radar absorbing materials (commonly called "loaded core") in stepped amounts 19, 20, 22, and 24 along the lateral axis 11C. Of course the core could be uniformly loaded. The method used for loading the individual cells, such as cells 26A and 26B of core 10, may vary as well as the type of material used to obtain the particular dB attenuation; however, it is not part of this invention and will not be discussed further. How this loaded core is inspected to insure that the proper attenuation is achieved throughout is the main thrust of the invention.

Figure 2:
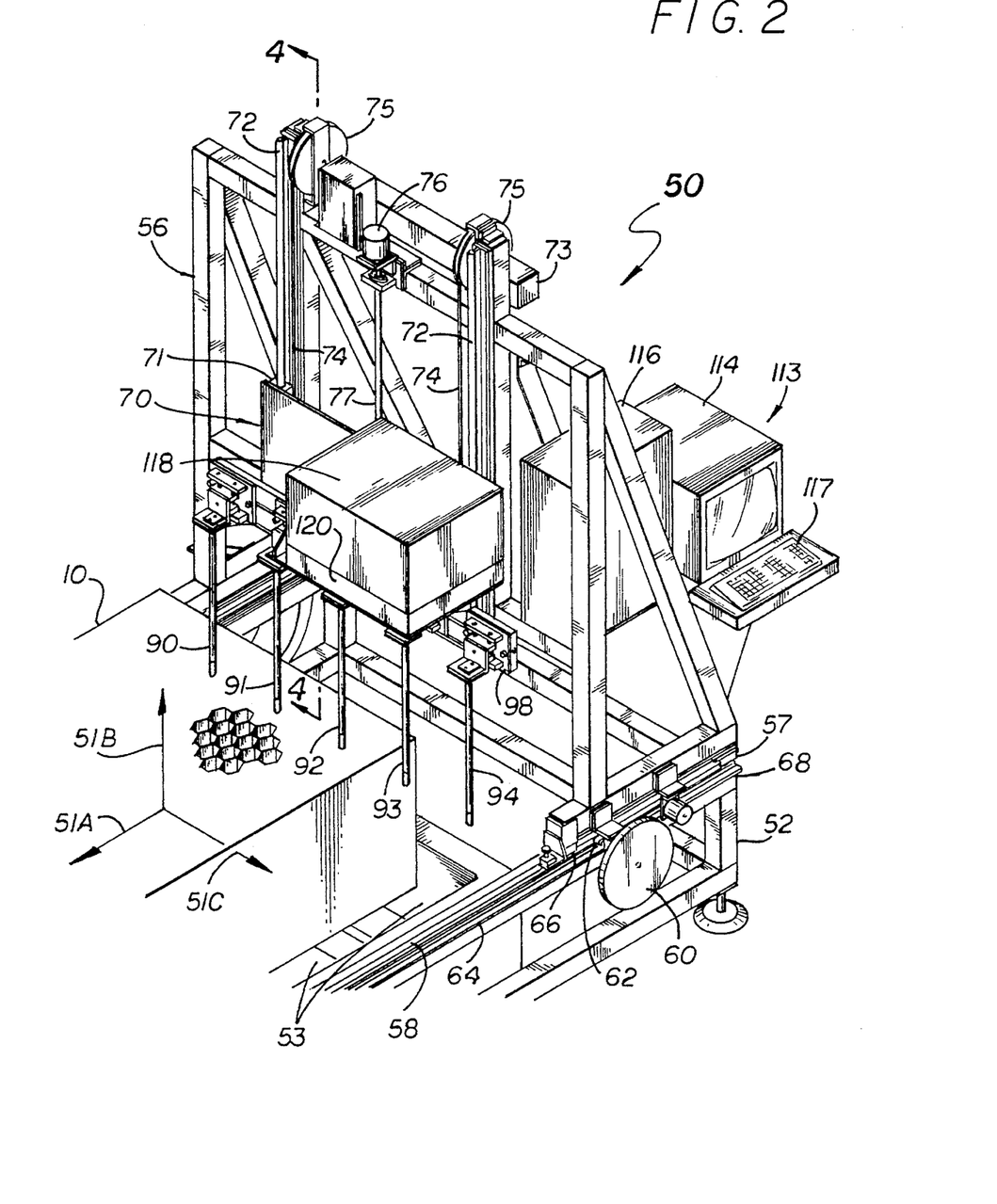
FIG. 2 is a perspective view of the apparatus incorporating the antenna assemblies in the process of inspecting honeycomb core.

Referring now to FIG. 2, the core 10 is shown mounted on the subject apparatus, generally indicated by numeral 50. The apparatus 50 has a longitudinal axis 51A, vertical axis 51B and a lateral axis 51C. It includes a stationary bed 54 having a plurality of openings 53 therein for mounting the core 10. A carriage 56 is movably mounted to the bed 52 by means of slides 57 that engage rails 58 mounted on either side of the bed. A hand driven gear assembly 60, that includes a pinon gear 62 engaged with a rack gear 64 mounted on the bed 52, is used to move the carriage 54 along the longitudinal axis 51A. A solenoid operated lock 66 that is engagable with the rack gear 64 is used to lock the carriage 54 in place when the actual inspection process is taking place. In addition, a position encoder 68 is mounted to the carriage 54 that is engaged with the rack gear 64 on the bed 52 and provides the carriage position indication relative to the bed 52 and, thus, the core 10.

A support assembly 70 is movably mounted to the carriage 56 by means of slides 71 that engage rails 72 mounted on either side of the carriage. The assembly 70 is counter balanced by a weight 73 attached by cables 74 riding over pulley wheels 75 mounted on carriage 56. A stepper motor 76 is used to drive a screw 77 mounted on the carriage 56 which moves the support assembly 70 up and down along the vertical axis 51B of the apparatus 50.

Attached to the support assembly 70 are a plurality of antenna assemblies 90, 91, 92, and 94 aligned along the lateral axis 51C, each adapted to act in both the transmitting and receiving mode. The spacing, indicated by numeral 96A is set such that the antennas can fit within cells of the core to be inspected, for example the spacing of cells 96B of cells 26A and 26B illustrated in FIG. 1. In order to accommodate different sizes of core or core with different cell spacing, the antenna assemblies 90–94 can be positioned at different locations along the lateral axis 51C of the apparatus by means adjustable attachment fittings 98.

Figure 3:
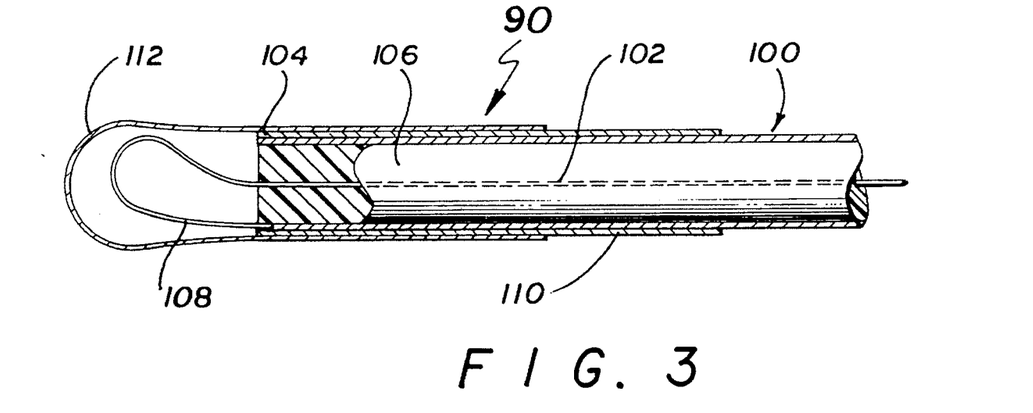
FIG. 3 is an enlarged cross-section view of one of the antenna assemblies.

As illustrated in FIG. 3, each antenna assembly includes a semi-rigid coax cable 100 having a center conductor 102 and an outer conductor 104 with a dielectric material 106 therebetween. The actual antenna portion 108 is a small wire in the form of a loop joined at its ends to the inner and outer conductors. In addition, it is desirable to cover at least a portion of the cable 100 with a magnetic radar absorbing material 110 to prevent the coax cable from effecting the measurement. Such materials are typically paints or resin sheets loaded with ferrite particles, with the amount and size of the particles determined by the particular application and frequencies of interest. It also attenuates the surface currents that would normally by generated on the outer conductor of the coax cable, thus confining the active area to the actual loop antenna. Finally, a cover 112 made of a low dielectric material is positioned over the antenna 108 to prevent damage and prevent dust and the like from collecting there around, which can also effect measurements. The antenna assemblies are flexible because the location and spacing of the cells of the core are not uniform and such flexibility easily compensates therefore.

Figure 4:
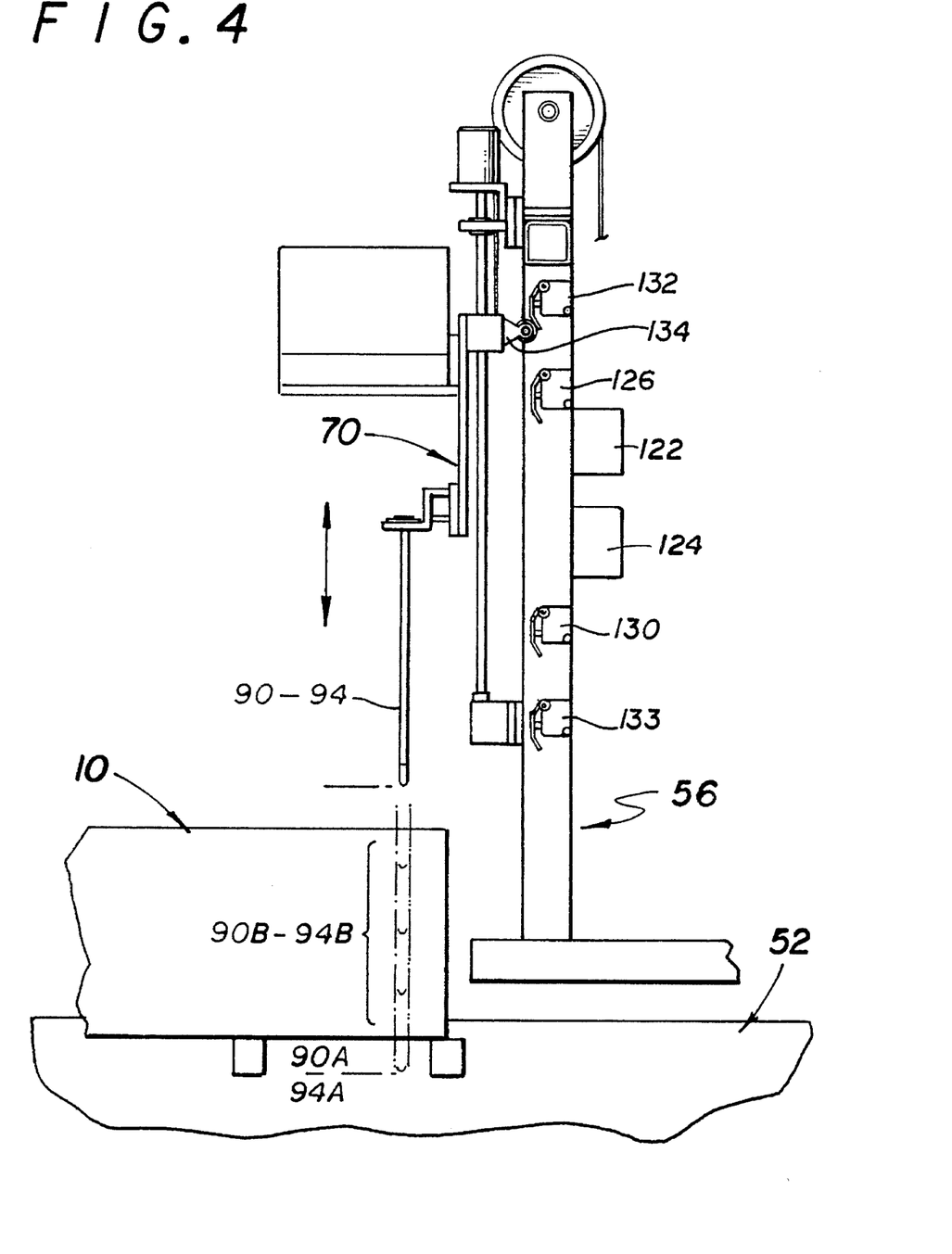
FIG. 4 is a partial cross-sectional view of the apparatus taken along the line 4—4.
Figure 5:
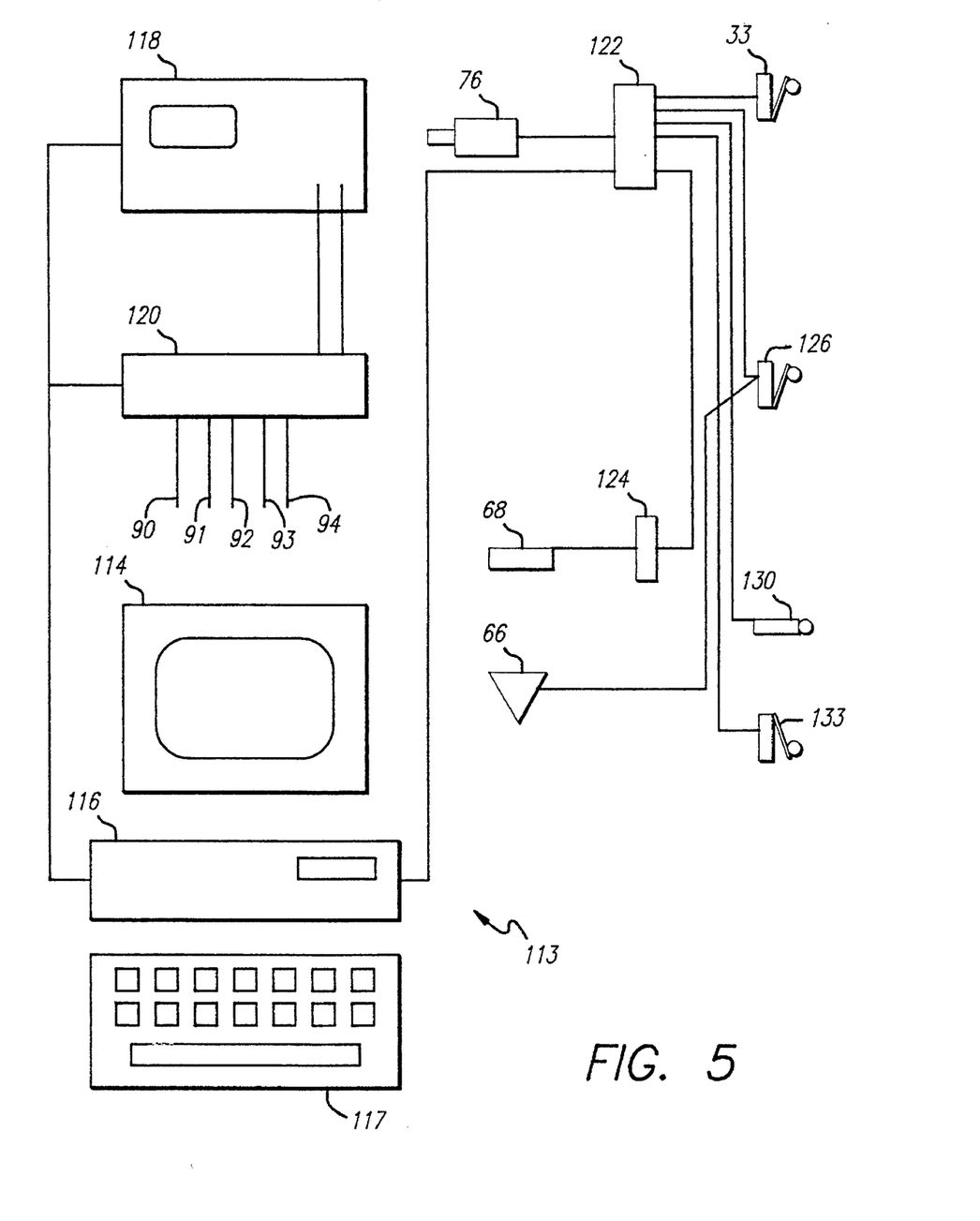
FIG. 5 is a block diagram the apparatus.

Referring now to FIGS. 2, 4 and 5 it can be seen that a computer assembly 113 comprising a display terminal (CRT) 114, computer 116 and keyboard 117, interfaces with the operator and executes the test sequences used to control the operation of the apparatus 50. The computer assembly 113 is typically an IBM Model 486 or its equivalent. The computer assembly 113 is coupled to both a network analyzer 118 and a switch matrix assembly 120, both of which are mounted on assembly 70. The network analyzer 118 is also coupled to the switch matrix 120 and the output from is coupled to the antenna assemblies 90–94. The switch matrix assembly 120 switches the network analyzer 118 to selected pairs of antenna assemblies 90–94, while the network analyzer provides electromagnetic energy to one of the selected pairs of antenna assemblies and receives the attenuated signal from the second, all under the control of the computer assembly 113. A suitable network analyzer 118 and matrix switch assembly 120 are Models 8720C and 87130A-K01, respectively, manufactured by the Hewlett Packard Corporation, Santa Rosa, Calif.

The computer assembly 113 is also coupled to a motor controller 122 that controls the stepper motor 76. The controller 122 is programmed to receive various inputs; for example, it is coupled to a encoder/decoder 124 that, intern, is coupled to and receives input signals from the position encoder 68 so that the computer assembly 110 knows where the antenna assemblies 90–94 are positioned along the longitudinal axis 51A (and the longitudinal axis 11A of the core 10). Both the motor controller 122 and encoder/decoder 124 are programmable so that they can be adapted to a particular machine such as the apparatus 50. A suitable stepper 76 and motor controller 122 (sold as a matched set) and encoder/decoder 124 are Model SX83-93 and AR-C, respectively manufactured by Compumotor, Incorporated, Rohnert Park, Calif.

Figure 6:
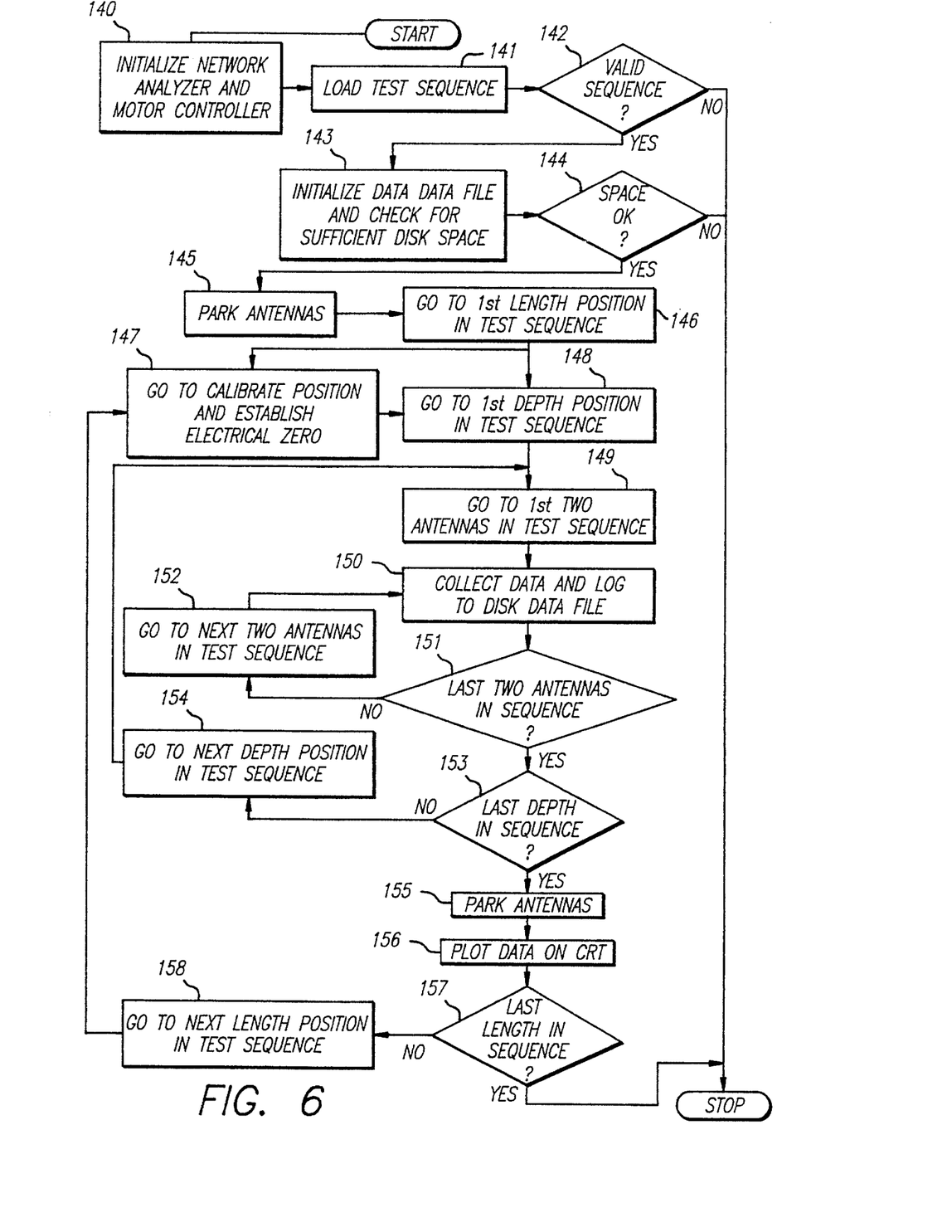
FIG. 6 is a flow chart of the computer program used to run the apparatus.

The controller 122 is also connected to the longitudinal axis carriage lock 66 which, as previously stated, prevents carriage 56 movement along the longitudinal axis 51A when the antenna assemblies 90–94 are inserted into the core 10. A park switch 126 is coupled to the controller 122 and is used for sensing when the antenna assemblies 90–94 are no longer inserted into the core 10 and provides this information to the computer 113 via the controller 122 and also provides the actuation signal to release the lock 66 when the antenna assemblies are parked (withdrawn from the core). A home position switch 130 senses when the antenna assemblies 90–94 are at a zero position extending through the core 10 such that the loop antennas 108 extend out of the core (indicated by numerals 90A–94A in FIG. 4)and provides this information via the controller 122 to the computer 113. Upper and lower limit position switches 132 and 133, respectively, are coupled to the controller 122 and provide indication of the safe limits of travel of the assembly 70 along the vertical axis 51B. The switches are actuated by a probe 134 mounted on the support assembly 70 that makes contact therewith as the support assembly moves up and down along the vertical axis 51B. Still referring to FIGS. 2, 4 and 5, and additionally to FIG. 6, the test sequence after the core is positioned on the bed 52 of the apparatus 50 operates as follows:

1. (Step 140) The network analyzer 118 and motor controller 122 are initialized to a pre-defined test configuration by signals transmitted by the computer assembly 113.
2. (Step 141) Available test sequences are listed and the operator is prompted to select the desired test sequence. The selected test sequence is then loaded.
3. (Step 142) Verification that the test sequence can be performed within the operating constraints of the system is made.
4. (Step 143) The disk space required to record the data set that will be generated by the test sequence is calculated.
5. (Step 144) A new data file is created and a check for the amount of available disk space is made.
6. (Step 145) The antenna assemblies 90–94 are parked by commanding the stepper motor 76 to move the antenna assemblies towards the park switch 126 and stop when the switch is contacted.
7. (Step 146) The first length position along the longitudinal axis 11A of the core 10 in the test sequence is looked up and the antenna assemblies 90–94 are positioned at that location by movement of the carriage 54 along the longitudinal axis 51A of the bed 52. This is indicated in FIG. 4 with the antenna assemblies indicated by numerals 90B–94B.
8. (Step 147) The antenna assemblies 90–94 are set at the calibrate position along the vertical axis 51B of the apparatus 50. This position is sensed by a home switch 130. The stepper motor controller 122 is commanded to make this the mechanical zero. The value from the network analyzer 118 is recorded as the electrical zero or free space zero reference.
9. (Step 148) The stepper motor 76 is commanded to position the antenna assemblies 90–94 to the first depth with the core 10 in the test sequence by moving the assembly 70 upward along the vertical axis 51B of the apparatus 50.
10. (Step 149) The switch matrix 120 to commanded to select the first two antenna assemblies to be used in the test sequence.
11. (Step 150) The data from the network analyzer 118 is collected, formatted and logged in to the data file.
12. (Step 151) A determination if this is the last two antenna assemblies in the test sequence is made.
13. (Step 152) The switch matrix assembly 120 is commanded to select the next two antenna assemblies in the test sequence.
14. (Step 153) A determination is made as to if this is the last depth in the test sequence.
15. (Step 154) The stepper motor controller 122 is commanded to position the antenna assemblies to the next depth in the test sequence.
16. (Step 155) The antenna assemblies 90–94 are parked by commanding the stepper motor controller 75 to move the antenna assemblies towards the park switch 126 and stop when the switch is contacted.
17. (Step 156) The data collected for the current length position is plotted on the monitor. Loss as a function of depth is plotted for each antenna assembly. This is a confidence plot to give the operation a snap shot of the data as it is being collected.
18. (Step 157) A determine is made as to if this is the last length in the test sequence.
19. (Step 158) The antenna assemblies are then positioned to the next length in the test sequence. This of course is accomplished by moving the antenna assemblies 90–94 to the parked position so that they are out of the core 10 and the carriage 56 is moved to a second location along the longitudinal axis 11A of the core 10 wherein measurements are required. It should be noted that the bed 52 could just as well be moved under a stationary "carriage". In addition, the carriage 56 movement could be programmed in so as to be automatic.

Figure 7:
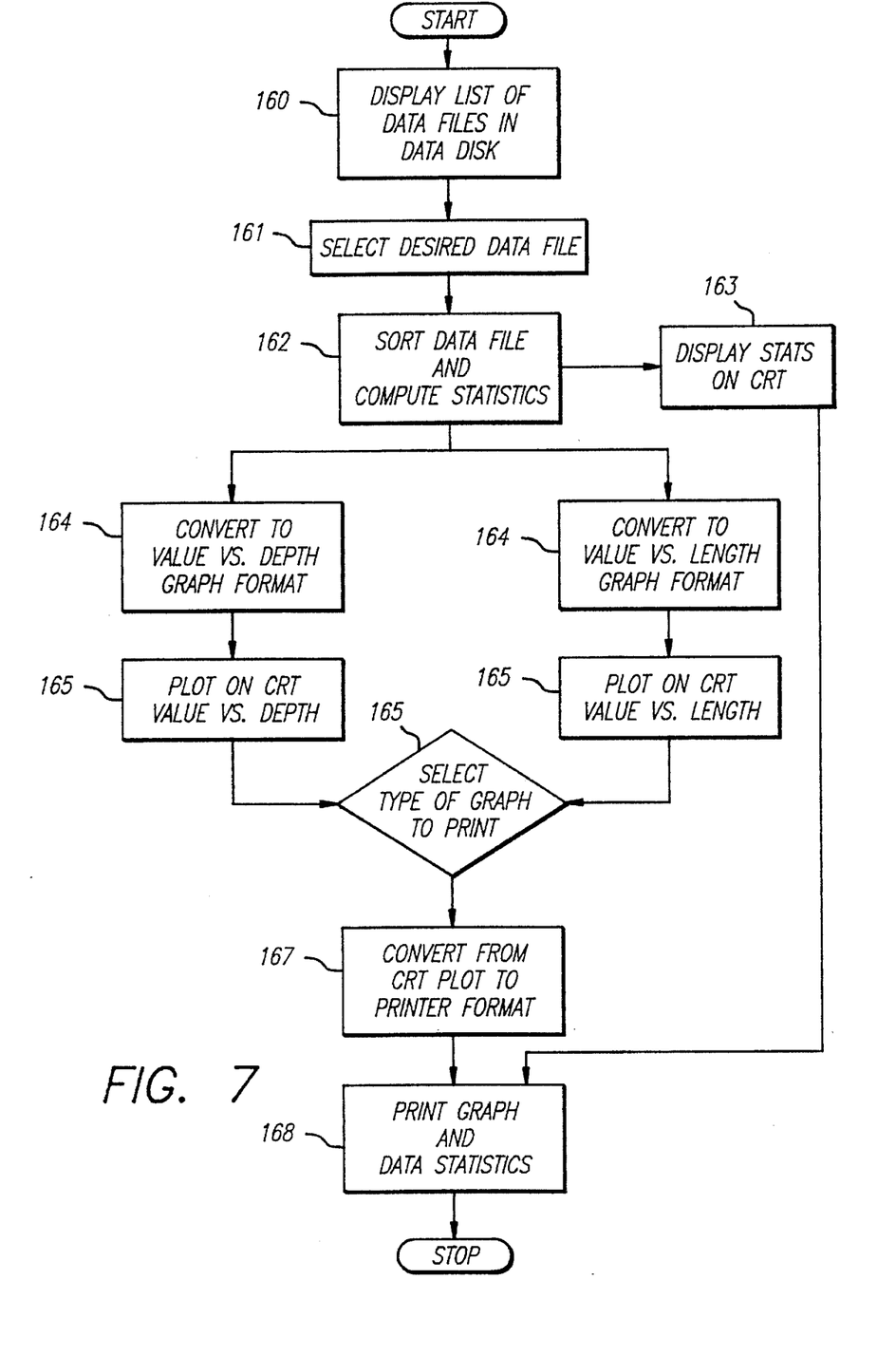
FIG. 7 is a flow chart of the computer program used to produce plots from the record test data.

In FIG. 7 is a flow chart of a computer program that can be used to plot the test results and comprises the following steps:

1. (Step 160) Read the disk directory and file headers and display the file names and headers on the monitor.
2. (Step 161) Read the data file selected by the operator.
3. (Step 162) Sort the data into arrays of values vs. depth and value vs. length and compute data statistics (average, maximum, minimum, and standard deviation) for the test data.
4. (Step 163) Display the computed statistics on the monitor.
5. (Step 164) Convert value vs. depth and length arrays into graph format
6. (Step 165) Plot the graph arrays on the monitor.
7. (Step 166) Select the plot to send to the printer.
8. (Step 167) Convert the selected monitor plot into printer format.
9. (Step 168) Print the plot and data statistics on the printer.

Figure 8:
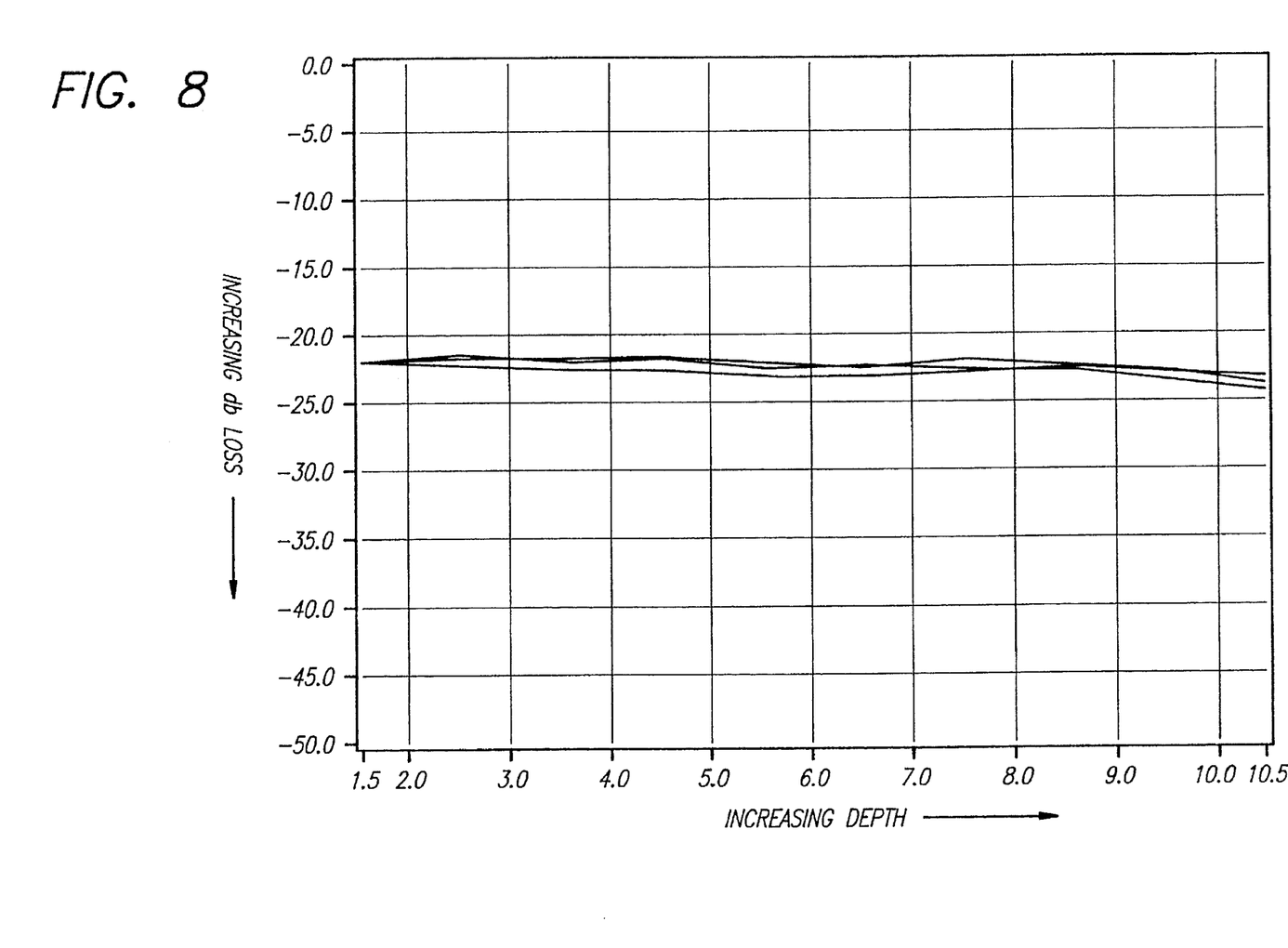
FIG. 8 is a typical plot of the attenuation in dB between cells as a function of depth produced by the apparatus.

A generalized plot of the typical attenuation in dB at a specific location as a function of depth in a core sample is presented in FIG. 8.

While the invention has been described with reference to a particular embodiment, it should be understood that the embodiment is merely illustrative as there are numerous variations and modifications which may be made by those skilled in the art. Thus, the invention is to be construed as being limited only by the spirit and scope of the appended claims.

INDUSTRIAL APPLICABILITY

The invention has applicability to the inspection equipment industry as well as industries providing military equipment incorporating radar absorbing structures.

I claim:

1. An apparatus for measuring the attenuation of electromagnetic radiation between cells of honeycomb core that includes a plurality of individual cells that extend from a top surface to a bottom surface thereof, the apparatus comprising:

- at least two antennas at a discrete distance from each other, each antenna operable in both an electromagnetic radiation transmitting and receiving mode;
- a positioning system for positioning said at least two antennas at a plurality of discrete positions within separate cells of the core between the top surface and bottom surface thereof; and
- means coupled to said at least two antennas for operating one of said antennas in a radiating mode and a second in a receiving mode and measuring the attenuation of the radiated electromagnetic radiation therebetween.

2. The apparatus as set forth in claim 1 wherein said antennas as loop antennas.

3. The apparatus as set forth in claim 2 wherein said loop antennas of each are mounted on the ends of shafts, said shafts having sufficient flexibility so as to be self aligning when entering the cells of the core.

4. The apparatus as set forth in claim 3 wherein said flexible shafts are covered with an electromagnetic energy absorbing material.

5. The apparatus as set forth in claim 4 wherein:
said flexible shafts are coaxial cables; and
said loop antennas of each set are formed from a loop of wire joined at one end to the center conductor and the other end to shield covering.

6. The apparatus as set forth in claim 5 wherein said at least two antennas can radiate and receive electromagnetic radiation at different frequencies.

7. The apparatus as set forth in claim 6 wherein said first and second antennas of each set are covered with a cover made of low dielectric material.

8. The apparatus as set forth in claim 7 wherein said portioning system comprises:
- a platform for mounting the core having a longitudinal, vertical and lateral axis;
- a carriage movable mounted on said platform, said carriage movable along said longitudinal axis; and
- a support assembly mounting said at least two antennas movably mounted to said carriage, said support assembly movably upward and downward along a vertical axis moving said at least two antennas within the core to selected specific locations.

9. The apparatus as set forth in claim 8 wherein said apparatus includes positioning means for sequentially positioning said support assembly along the vertical axis such that said at least two antennas assemblies are sequentially positioned at different depths within the cells of the core.

10. The apparatus as set forth in claim 9 wherein said means comprises:
- a network analyzer for providing an input signal to one selected antenna of said at least two antennas and measuring the attenuated electromagnetic radiation received by a second selected antenna; and
- a switching matrix assembly for sequentially selecting and connecting said antennas to said network analyzer.

11. The apparatus as set forth in claim 10 further comprises a computer having a computer program for controlling said network analyzer, switching matrix assembly and positioning means such that the attenuation of the electromagnetic radiation between said selected antennas of said at least two antenna assemblies can be automatically measured throughout the depth of the core at specific locations along its length and width.

12. An apparatus for measuring the attenuation of electromagnetic radiation between cells of honeycomb core that includes a plurality of individual cells that extend from a top surface to a bottom surface thereof, the apparatus comprising:

- at least two antennas at a discrete distance from each other, each antenna operable in both an electromagnetic radiation transmitting and receiving mode;
- a positioning system for positioning said at least two antennas at a plurality of discrete positions within separate cells of the core between the top surface and bottom surface; and
  - a platform for mounting the core having a longitudinal, ertical and lateral axis;
  - a carriage movable mounted on said platform, said carriage movable along said longitudinal axis; and
- a support assembly mounting said at least two antennas movably mounted to said carriage, said support assembly movably upward and downward along a vertical axis moving said at least two antennas within the core to selected specific locations; and
- means coupled to said at least two antennas for operating one of the antennas in a radiating mode and a second in a receiving mode and measuring the attenuation of the radiated electromagnetic radiation therebetween.

13. The apparatus as set forth in claim 12 wherein said antennas are loop antennas.

14. The apparatus as set forth in claim 13 said loop antennas of each are mounted on the ends of shafts, said shafts having sufficient flexibility so as to be self aligning when entering the cells of the core.

15. The apparatus as set forth in claim 14 wherein said flexible shafts are covered with an electromagnetic energy absorbing material.

16. The apparatus as set forth in claim 15 wherein:
said flexible shafts are coaxial cables; and
said loop antennas of each set are formed from a loop of wire joined at one end to the center conductor and the other end to shield covering.

17. The apparatus as set forth in claim 16 wherein said at least two antennas can radiate and receive electromagnetic radiation at different frequencies.

18. The apparatus as set forth in claim 17 wherein said first and second antennas of each set are covered with a cover made of low dielectric material.

19. The apparatus as set forth in claim 18 wherein said apparatus includes
positioning means for sequentially positioning said support assembly along the vertical axis such that said at least two antennas assemblies are sequentially positioned at different depths within the cells of the core.

20. The apparatus as set forth in claim 19 wherein
said means comprises:
- a network analyzer for providing an input signal to one selected antenna of said at least two antennas and measuring the attenuated electromagnetic radiation received by a second selected antenna; and
- a switching matrix assembly for sequentially selecting and connecting said antennas to said network analyzer.

21. The apparatus as set forth in claim 20 further comprising a computer having a computer program for controlling said network analyzer, switching matrix assembly and positioning means such that the attenuation of the electromagnetic radiation between said selected antennas of said at least two antenna assemblies can be automatically measured throughout the depth of the core at specific locations along its length and width.

* * * * *